United States Patent [19]

Daughton et al.

[11] Patent Number: 5,251,170

[45] Date of Patent: Oct. 5, 1993

[54] OFFSET MAGNETORESISTIVE MEMORY STRUCTURES

[75] Inventors: James M. Daughton, Edina, Minn.; Arthur V. Pohm, Ames, Iowa

[73] Assignee: Nonvolatile Electronics, Incorporated, Plymouth, Minn.

[21] Appl. No.: 786,128

[22] Filed: Nov. 4, 1991

[51] Int. Cl.⁵ ............................................. G11C 11/15
[52] U.S. Cl. .................................. 365/158; 365/173; 257/295; 427/123
[58] Field of Search ............... 365/145, 158, 171, 173; 257/295; 427/123

[56] References Cited

U.S. PATENT DOCUMENTS

| | | | |
|---|---|---|---|
| 4,731,757 | 3/1988 | Daughton et al. | 365/173 |
| 4,754,431 | 6/1988 | Jenson | 365/158 |
| 4,780,848 | 10/1988 | Daughton et al. | 365/173 |
| 4,829,476 | 5/1989 | Dupuis et al. | 365/158 |
| 4,857,418 | 8/1989 | Schuetz | 428/693 |
| 4,897,288 | 1/1990 | Jenson | 427/123 |
| 4,918,655 | 4/1990 | Daughton | 365/173 |
| 4,945,397 | 7/1990 | Schuetz | 357/71 |
| 5,012,444 | 4/1991 | Hurst, Jr. et al. | 365/173 |
| 5,064,499 | 11/1991 | Fryer | 156/643 |

Primary Examiner—Joseph A. Popek
Attorney, Agent, or Firm—Kinney & Lange

[57] ABSTRACT

A digital memory having a plurality of electrically connected bit structures extending over a path with adjacent ones offset from one another in a direction substantially perpendicular to that path. The bit structures are formed of two ferromagnetic films with an exchange coupling barrier therebetween.

14 Claims, 7 Drawing Sheets

OFFSET MAGNETORESISTIVE MEMORY STRUCTURES

This invention was made with Government support under Contract NAS7-1077 awarded by the National Aeronautical and Space Administration. The Government has certain rights in the invention.

BACKGROUND OF THE INVENTION

The present invention relates to ferromagnetic thin-film memories and, more particularly, to ferromagnetic thin-film memory cells in which information states of memory cells therein are determined through magnetoresistive properties of the thin-film cells.

Digital memories are used extensively in digital systems of many kinds including computers and computer system components, and digital signal processing system. Such memories can be advantageously based on the storage of digital bits as alternative states of magnetization in magnetic materials in each memory cell, particularly thin-film magnetic materials, resulting in memories which use less electrical power and do not lose information upon removals of such electrical power.

These memories may be ferromagnetic thin-film materials in the memory cells through which access to the information stored therein can be provided by either inductive sensing to determine the magnetization state, or by magnetoresistive sensing to make such a determination, with sufficiently small memory cell sizes favoring magnetoresistive sensing because significantly more output signal is available. Such ferromagnetic thin-film memories may be provided on a surface of a monolithic integrated circuit to provide convenient electrical interconnections between the memory cells and the memory operating circuitry.

Ferromagnetic thin-film memory cells can be made very small and packed very closely together to achieve a significant density of information being stored, particularly when provided on a surface in a onolithic integrated circuit. The magnetic environment there can become quite complex with fields in any one memory cell affecting the film portions in neighboring memory cells. Also, small ferromagnetic film portions in a memory cell can lead to substantial demagnetization fields which can cause instabilities in the magnetization state desired in such a cell as will be further described below.

These magnetic effects between neighbors in an array of closely packed ferromagnetic thin film memory cells can be ameliorated to a considerable extent by providing a memory cell based on an intermediate separating material having two major surfaces on each of which an anisotropic ferromagnetic memory thin-film is provided. Such an arrangement provides a significant "flux closure", i.e. a more closely confined magnetic flux path, to thereby confine the magnetic field arising in a cell to affecting primarily just that cell. This is considerably enhanced by choosing the separating material in the ferromagnetic thin-film memory cells to each be sufficiently thin.

Often such a digital memory is constructed by having a number of bit structures connected in series at junctures to one another in an end-to-end fashion to form a sense line current path. A series of current straps, or wordlines, are often provided in an orthogonal layout to a series of connected bit structures, or sense lines, so that a strap crosses each of the bit structures between the junctures connected thereto. In a magnetoresistive memory, such straps or wordlines are used both in the entering of, and the sensing of, information in the bit structures. This can be done by using currents in the wordlines for setting, or for determining the existing, magnetization state of bit structures storing bits of digital information each in a cell in the memory. Examples of such devices are described in more detail in U.S. Pat. No. 4,731,757 to Daughton et al and U.S. Pat. No. 4,780,848 to Daughton et al, both of which are hereby incorporated herein by reference.

The ferromagnetic thin-film in a memory cell, most often formed as two film portions on either side of the intermediate layer, is typically formed of an alloy of nickel, cobalt and iron in proportions of approximately 60%, 20% and 20%, respectively. Usually, these proportions are chosen to strongly reduce or eliminate any magnetostrictive effects in the film, and to improve certain other properties of the film for its intended use. In some situations, other materials are added to the alloy in relatively small amounts to improve certain properties of the film.

Such films can be fabricated by vacuum deposition or other methods and, if done in the presence of a magnetic field oriented in a selected direction, the resulting ferromagnetic thin-film will exhibit uniaxial anisotropy with the easy axis parallel to the direction in which the magnetic field is oriented during fabrication (which is typically such as to be parallel to the device wordline and so perpendicular to the path taken by the end-to-end bit structures forming a sense line). Because very large demagnetization fields would otherwise result, the magnetization vector of such a film will always lie in a plane of the film.

Furthermore, in accord with thermodynamics, the magnetization in such a film will arrange itself to minimize the magnetic energy therein. In the absence of any externally applied magnetic fields, such minimization occurs when the magnetization vector of a film portion parallels the easy axis of the film portion pointing in either direction along such axis.

However, the situation of such a film portion changes in the presence of externally applied magnetic fields and the minimization of magnetic energy may then occur with the magnetization vector of the film oriented at an angle with respect to the easy axis. As long as the magnetization of the film portion is in a single domain state, the magnetization vector can be caused to rotate with respect to the easy axis to reach angles determined by the externally applied fields, and this can occur without substantially affecting the magnitude of the magnetization.

Such ferromagnetic thin-films as those just described as the memory film on either side of the intermediate layer in the bit structures further exhibit magnetoresistance. Differences in direction between that of the magnetization vector in the memory film, and that of a current passed through the film, leads to differences in the effective electrical resistance in the direction of the current. The maximum electrical resistance occurs when the magnetization vector in the film and the current direction are parallel to one another, while the minimum resistance occurs when they are perpendicular to one another. Electrical resistance of such a magnetoresistive memory film can be shown to be given by a constant value, representing the minimum resistance, plus an additional value depending on the angle between the current direction in the film and the magnetization vector therein. This additional resistance follows a square of the cosine of that angle.

As a result, external magnetic fields can be used to vary the angle of the magnetization vector in such a film portion with respect to the easy axis of the film, and can vary it to such an extent as to cause switching the magnetization vector between two stable states which occur as magnetizations in opposite directions along the easy axis. Further, the state of the magnetization vector in such a film portion can be measured or sensed by the change in resistance encountered by current directed through this film portion. This provides the basis for a memory film portion to serve as part of a bit structure in a memory cell, the state of which is subject to being determined by effects occurring in currents applied to this portion. U.S. Pat. No. 4,829,476 to DuPuis et al and U.S. Pat. No. 5,012,444 to Hearst et al describe devices using such magnetoresistive sensing, and are hereby incorporated herein by reference.

Although the two states in which the magnetization vector can occur in the bit structure ferromagnetic thin-films in the absence of external magnetic fields, i.e. the film magnetization being oriented in one of two directions along the film easy, axis were described as stable in the foregoing paragraph, such stability can be lost as the size of the memory cell, or the bit structure forming that memory cell, is decreased. This potential loss of stability comes about because the film magnetization is subject to being altered in direction from either of the two expected directions along the bit structure ferromagnetic thin-film easy axis even though no significant external magnetic fields are present. Such a situation in the film material can lead to the magnetization in some portions thereof being at an angle with respect to the easy axis, even to the point of being perpendicular thereto, or oriented to even a greater angle than 90° thereto.

The primary such magnetic effect in the magnetoresistive, anisotropic ferromagnetic thin-films used in the memory cell bit structures is known as "curling" and results from the presence of large demagnetization fields in the bit structure memory film. The upper one of the two such memory film portions for a typical bit structure is shown in representational form in FIG. 1, and has shown thereon arrows giving the direction of the magnetization of that film at the locations at which those arrows begin. The easy axis in the presentation is oriented vertically in FIG. 1 and so substantially parallels the magnetizations occurring at the center of the film.

Figure 1:
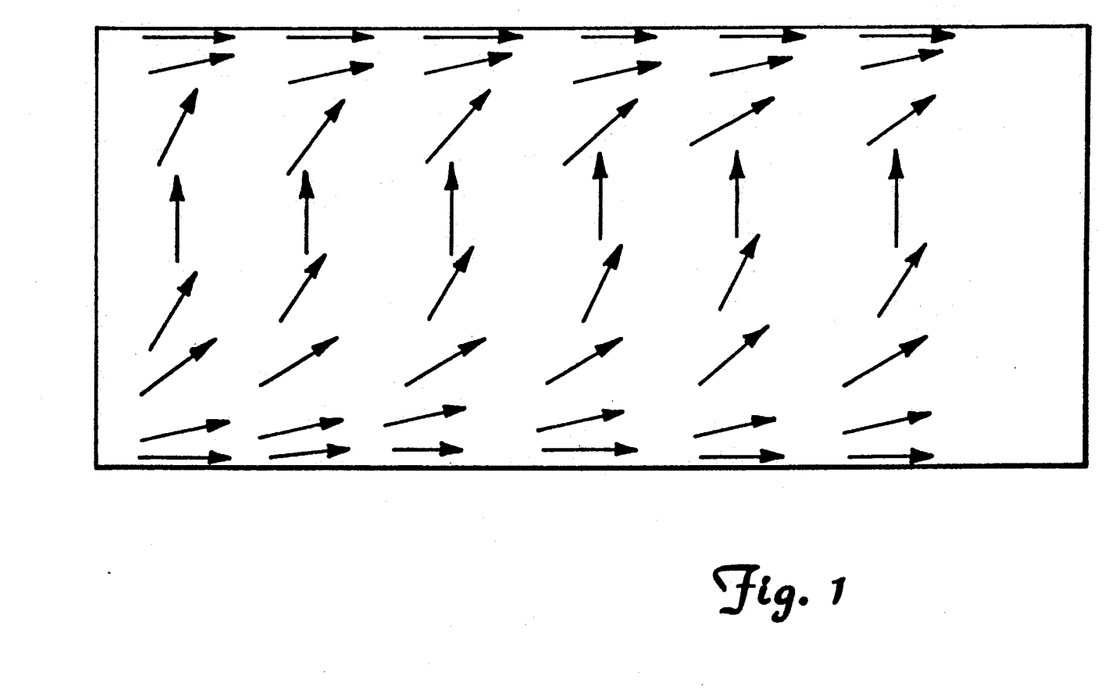
FIG. 1 is a diagram representing a cell film.

However, because of the relative closeness of the top and bottom edges of the film in FIG. 1, the demagnetizing fields due to "free poles" occurring along those edges are quite high and lead to reorienting the magnetization near those edges where the demagnetizing fields are the greatest, i.e. "curling" results. That is, the electron spins of the film material atoms at the top and bottom edges of the films are constrained to lie nearly parallel to these edges in the direction of elongation of the film portion, and so nearly parallel to the film hard axis, or nearly perpendicular to the film easy axis. This orientation results in minimizing the magnetic energy in the film due to the presence of both the demagnetization field and the anisotropy field which is a measure of the strength of the preference of the film material for the magnetization being along the easy axis.

The directions of the film material atoms electron spins, or the film magnetization, only gradually turn to parallel the film easy axis as the interior of the film portion is approached since the demagnetizing field decreases toward the film interior to the point of being more and more overcome by the anisotropy field. Thus, the magnetization component along the easy axis of the film portion in FIG. 1 has a value near zero at the upper and lower edges in FIG. 1 where the wordline over the bit structure would cross those edges, and gradually this easy axis magnetization component increases toward the interior of the film portion. In those interior regions of the film, beginning from near the upper and lower edges and extending to the film center, the easy axis magnetization component value increases toward the saturation value of the film material and reaches that value toward the film center in a single magnetic domain situation.

As can be seen, such magnetoresistive, anisotropic ferromagnetic thin-films, having their easy axis extending in a direction parallel to the wordline and perpendicular to the direction of elongation of the film, do not really saturate across the film along the easy axis, but only saturate across a portion of the film in the interior thereof. Further, while external magnetic fields may cause the magnetization of the interior portions to switch between opposite states along the easy axis, such switching will not have much effect on the magnetization of the portions near the upper and lower edges of the film portion in FIG. 1 because of the strength of the demagnetizing fields unless impractically large external magnetic fields are used. Hence, the change in resistance measured by an electrical current along the direction of elongation of the film portion will not have a contribution to it from the upper and lower edge portions of the film of FIG. 1. This means there will be a smaller resistance change than would otherwise be possible from a film portion of that size, and so a smaller output signal from the memory cell using such a film portion to indicate its magnetization state, and so the value of the digital bit stored therein.

The distance from the upper and lower edges of the film portion in FIG. 1 to the points where the film magnetization direction is more or less parallel to the easy axis, or its natural lowest energy direction in the absence of external magnetic fields, is found by minimizing the magnetic energy in the film. This includes the anisotropy energy, the exchange energy and the demagnetization energy. The anisotropy energy is minimized by a rapid return along this distance of the magnetization to being parallel with the easy axis. The exchange energy, determined from quantum mechanics and based on the change of angle between adjacent atoms magnetic spin, is minimized by having the adjacent electron spins parallel with one another and so tends toward having the magnetization parallel the easy axis along this distance but relatively weakly. The demagnetizing energy does not change very significantly with changes in the local magnetization, and so distances from the edges to the points where the magnetization parallels the easy axis is primarily determined from jointly minimizing the anisotropy and exchange energies. Such distances are denominated as "curling distances."

Reducing the size of the memory film portion in order to construct memories having larger numbers of memory cells therein by increasing the surface density of such cells will further reduce the output signal from the memory cell. This follows because any closer approach of the upper and lower edges tends to strengthen the demagnetizing field due to the free poles therealong so that the "curled" portions near the edges remain with the magnetization thereof being urged toward being parallel to those edges over more or less the same "curling distances" in the film of smaller cells as it is in larger cells. Thus, the memory cell bit structure output signal generating portions, the film interior portions, effectively suffer the primary size reduction as the overall film surface dimensions are reduced in a memory cell.

Figure 2:
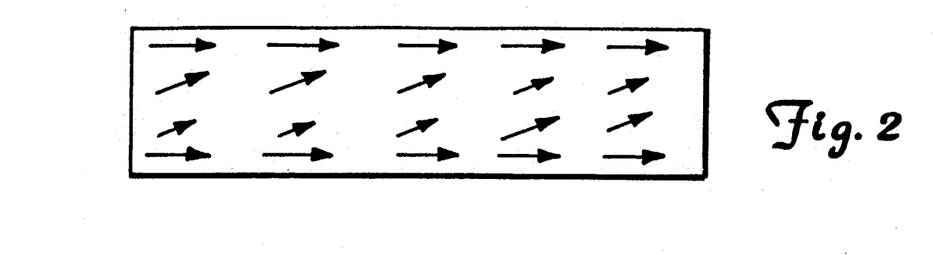
FIG. 2 is a diagram representing a cell film.

Clearly, this output signal loss cannot be taken too far if an output signal is to be obtained from the memory cell portion that is sufficient to indicate the magnetization state therein, and so minimum memory cell dimensions must be observed in these circumstances if an output signal of sufficient magnitude is to be obtained. Otherwise, if the cell size reduction is taken too far, there will be no portions of the film magnetization which would parallel the easy axis thereof, and so there will not be a pair of stable states along the easy axis for that magnetization to be switched between by external magnetic fields. Such a result is shown in FIG. 2 where any vertical, or easy axis, magnetization component anywhere in the film portion is very small. Hence, a memory cell structure is desired which can have reduced dimensions to increase the memory system digital bit, or stored information, density but still maintain adequate cell output signals indicating the cell state.

SUMMARY OF THE INVENTION

The present invention provides a digital memory having a plurality of electrically connected bit structures extending over a path with adjacent ones of these bit structures being offset from one another in a direction substantially perpendicular to that path. These bit structures are based on having an intermediate separating material with two major surfaces on either of which an anisotropic ferromagnetic memory film exhibiting magnetoresistance is provided. Wordlines are provided across from these bit structures.

Such bit structures can be provided by forming elevated portions and depressed portions alternatingly in a substrate. Bit structures are then formed in these elevated and depressed portions, and wordlines are provided across from selected ones thereof.

DETAILED DESCRIPTION OF THE PREFERRED EMBODIMENTS

Figure 3:
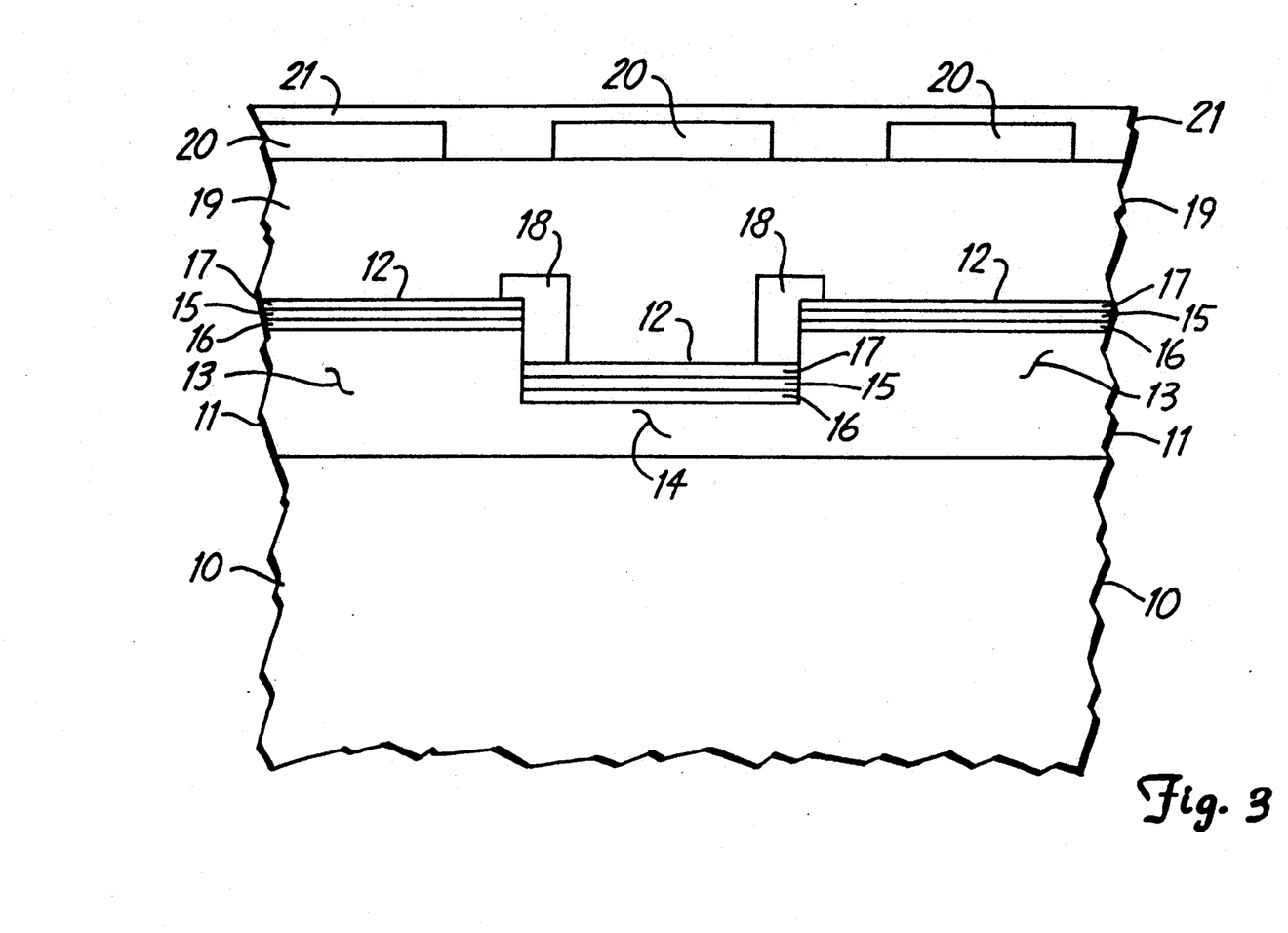
FIG. 3 is a diagrammatic representation of a portion of a device embodying the present invention.

FIG. 3 shows in diagrammatic form a cross sectional view of portion of a digital memory device formed in a monolithic integrated circuit chip. This chip has a semiconductor material substrate, 10, in which electronic integrated circuits are provided for operating the digital memory. An electrically insulating layer, 11, is provided thereon, the upper surface of layer 11 in the device portion shown supporting three composite magnetic structures, 12, each of which is shown vertically offset, either up or down, with respect to the bit structure adjacent thereto as these bit structures extend over a path from left to right in FIG. 3 to form a sense line. These vertical offsets between adjacent bit structures 12 are the result of insulating layer 11 having elevated portions, 13, provided therein alternating with depressed portions, 14, also provided therein.

Each of composite magnetic structures 12 forming a bit structure, or memory cell, comprises an intermediate layer, 15, which is formed of a non-magnetic material, such as copper or tantalum nitride, to provide an exchange coupling barrier to the direct coupling across the space taken by this layer of the magnetizations in ferromagnetic films positioned on either side thereof. In accord, on either side of intermediate layer 15 in each of bit structures 12 is provided a pair of magnetoresistive, ferromagnetic thinfilm portions, 16 and 17, as the memory cell magnetic memory material exhibiting uniaxial anisotropy with the easy axis thereof perpendicular to the plane of FIG. 3.

The ends of the outer two of the three bit structures 12 shown in FIG. 3 have electrical conductors serving as bit junctures, 18, positioned thereagainst, and forming electrical connections therewith. Bit junctures 18 also extend down to layer 17 of the central bit structure 12 shown, and make electrical connection therewith, to provide an electrically conductive path so that a current may be introduced through all three of bit structures 12 in series with one another. Such an interconnection arrangement continues to the right and to the left through further numerous bit structures, the last on either end connecting to a corresponding end terminal at which electrical current can be supplied or drawn to thereby complete a sense line.

A further insulating layer, 19, is provided over bit structures 12 and bit junctures 18. Above insulator 19, and across from each of bit structures 12, are provided three wordlines, 20, which are electrically conductive so as to be able to pass current in or out of the plane of FIG. 3. (Circuit interconnections between the memory chip portion structures and the integrated circuits in substrate 10 are also provided through and on layer 19 but are not shown.) A passivation layer, 21, is provided over wordlines 20 and portions of insulator 19 to protect the structures therebelow from external contaminants.

There are two primary differences between the structure of FIG. 3 and previously known memories based on bit cell structures having a pair of magnetoresistive, anisotropic ferromagnetic thin-film portions separated by an intermediate layer: the first of these being the offsets between adjacent memory cells, or bit structures 12, and the other being the much smaller size of bit structures 12 in the dimensions thereof parallel to the upper surface of layer 21 in FIG. 3, which also go along with a different geometrical outline. These primary differences lead to significantly improved memory cells in a memory which has significantly increased numbers thereof in a given surface area parallel to the upper surface of layer 21, i.e. an increased surface density of such memory cells.

In earlier versions of such memories, the ends of adjacent bit structures, electrically connected by bit juncture structures, were positioned close to one another in approximately the same plane so that the magnetic fields at the end of one bit structure had the effect of increasing the effective demagnetizing field on the end portion of the adjacent bit structure so as to tend to keep magnetizations of both ends substantially perpendicular to the easy axis of each bit structure. Because of the introduction of added spatial separation between these ends in FIG. 3 by offsetting each of bit structures 12 from one another, these offsets being vertical in FIG. 3, this coupling between adjacent bit structure ends has been greatly reduced.

With these offsets, the demagnetizing field resulting in each bit structure at the bit juncture ends across the offset from one another becomes sufficiently strong to maintain a "curl" direction of the magnetization parallel to those ends, and so the film magnetizations at those film ends across the offset are forced to be parallel to the easy axis of each bit structure. If the memory cells are then also reduced in size so that the distance across a bit structure 12 between two bit junctures 18 is less than approximately the "curling distance," the magnetization of the entire resulting bit structure 12 films behave like a collective system of electron spins such that there is a single domain across the bit structure that is oriented by the magnetization "curling" at the bit juncture ends of that bit structure. Thus, for bit structures smaller than about 0.5 µm on a side, the exchange coupling keeps the spins in each film substantially coupled together as a unit.

Figure 4:
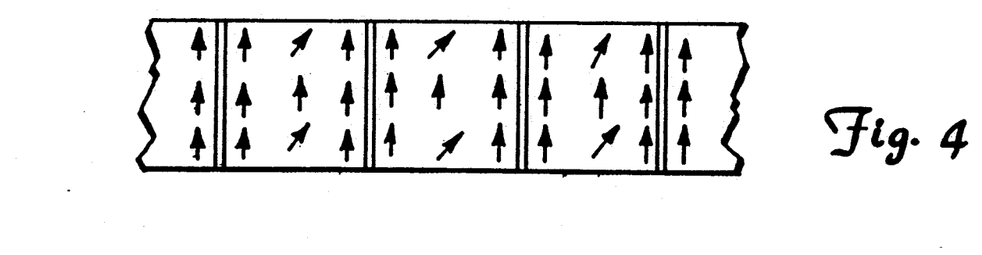
FIG. 4 is a diagram representing several cell films.

This result is shown in FIG. 4 where the three smaller sized bit structures are represented with some additional portions of a fourth and fifth one on either end thereof. The double vertical lines represent the electrical conductors at the offsets between adjacent bit structures.

Further, the magnetizations of the films 16 and 17 will be antiparallel to one another to minimize magnetic energy so, with a small enough thickness in layer 15 separating these films, the magnetization of one film aids the other in maintaining this relationship against the field from a neighboring bit structure otherwise acting to turn the magnetization of the bit structure perpendicular to the film easy axis. This situation will be maintained if the separation across the offsets is at least twice as great as the thickness of intermediate layers 15 between the memory layers 16 and 17 in bit structures 12 because the added reluctance in the magnetic path between adjacent bit structures 12, as previously indicated, substantially reduces the effect of the adjacent bit structure attempting to maintain an antiparallel relationship between the film magnetizations perpendicular to the easy axis.

Thus, the dimensions of the bit structures must be carefully chosen to assure that both the desired exchange coupling occurs to provide an effectually single domain behavior in each film portion, and that the effective magnetization of the upper and lower films in the bit structure are directed parallel to the wordline and across the sense line formed by the series connected bit structures, rather than in the opposite situation of being perpendicular to the word line. Just which of these two resulting magnetization situations occurs in the absence of external fields depends on which has the lower energy as determined primarily by the memory film anisotropy, the offset distance, the thickness in the intermediate layer, and the length and width of each cell. The uncancelled demagnetizing fields $H_1$ for the first situation of having the effect of film magnetization parallel to the wordline in the easy axis is approximately $H_1 = kM_sST_f/W$. Similarly, the uncancelled demagnetizing fields $H_2$ for the second situation in which the effective magnetization is perpendicular to the wordline and the easy axis is approximately $H_2 = 2CkM_sGT_f/L$. The constant k is one which depends on geometry details of the bit structure, $M_s$ is the saturation magnetization of the ferromagnetic thin-films in the bit structure, S is the thickness of the intermediate layer between the ferromagnetic thin-films, G is the offset separation between adjacent bit structures, $T_f$ is the thickness of the ferromagnetic thin-film memory layers, W is the width between the upper and lower edges of the bit structures in FIG. 4, L is the length between bit junctures on either side of a bit structure in FIG. 4, and C is a constant less than one accounting for the effect of other gaps between other bit structures in the series arrangement thereof.

If $H_1$ is larger than $H_2$, the magnetizations of the ferromagnetic thin-films in the bit structures will tend to prefer to be perpendicular to the easy axis and the wordline. If, on the other hand, $H_2$ is larger than $H_1$, the opposite will occur in which the magnetization will tend to be parallel to the wordline and the easy axis of the films. $H_2 - H_1 + H_k$ is the effective anisotropy field, where $H_k$ is the material anisotropy field which is a measure of the preference of the magnetization to lie along the easy axis due to its material properties. The effective anisotropy field is the total field necessary to saturate the two ferromagnetic thin-film portions in a bit structure given the easy axis being parallel to the wordline. If bit structure length L is sufficiently large compared to bit structure W, the result will be more like previously known bit structures since exchange coupling will not keep the magnetization of the bit structure effectively a single domain. In very small bit structures, the material anisotropy field $H_k$ will be smaller than the uncancelled demagnetization fields $H_1$ and $H_2$, and so the effective anisotropy field will be dominated by $H_1$ and $H_2$ to allow controlling the outcome as to where the effective magnetization is directed, preferably along the easy axis as shown in FIG. 4.

Thus, the structure of FIG. 3 provides substantial improvement in the memory cells in that a much smaller cell area, or bit structure 12 surface area, will be achieved without "curling" depriving the cell of its ability to provide a significant output signal. However, fabrication of the structure shown in FIG. 3 is relatively difficult, thus leading to consideration of alternative embodiments in the fabrication thereof. FIGS. 5A through 5D show the results of fabrication steps for a first alternative embodiment again formed on substrate 10 which is typically a semiconductor material monolithic integrated circuit formed of either silicon or gallium arsenide having transistors and other components therein as needed for operating the magnetic memory, and possibly providing other circuit capabilities.

These figures, the previous ones, and those following are not to scale, and are not in proportion, for purposes of clarity. Some of the fabrication steps shown are more fully described in U.S. Pat. No. 4,754,431 to Jenson, U.S. Pat. No. 4,857,418 to Schuetz, U.S. Pat. No. 4,897,288 to Jenson, U.S. Pat. No. 4,918,655 to Daughton, and U.S. Pat. No. 4,945,397 to Schuetz which are hereby incorporated herein by reference.

Figure 5A:
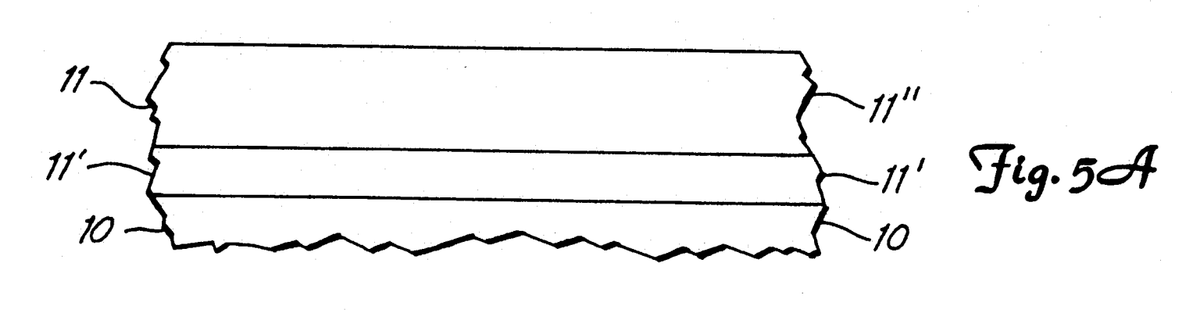
FIGS. 5A through 5D are diagrammatic representations of the results of steps taken in fabricating a device embodying the present invention.

An electrically insulative layer 11 is again used to prevent undesired electrical contacts between the memory structures of the monolithic integrated circuit of substrate 10, but this insulative layer is shown in FIG. 5A as a composite layer having two layer portions, 11' and 11". Layer 11' is formed of silicon dioxide and conveniently chosen to be from 2,000 to 6,000 Å thick. Layer 11" is formed of silicon nitride so that when etched, layer 11' will be an etching stop since it is formed of a different material, silicon oxide, not subject to being etched by the etching steps used in etching layer 11". Layer 11" is typically chosen to have a thickness from 100 to 1,000 Å. Alternatively, an insulator layer of a single one of these materials could be used in connection with use of an etching step in which time determines the depth of the etch rather than an etch stop material. Both layers 11' and 11" are typically provided using a sputter deposition.

Figure 5B:
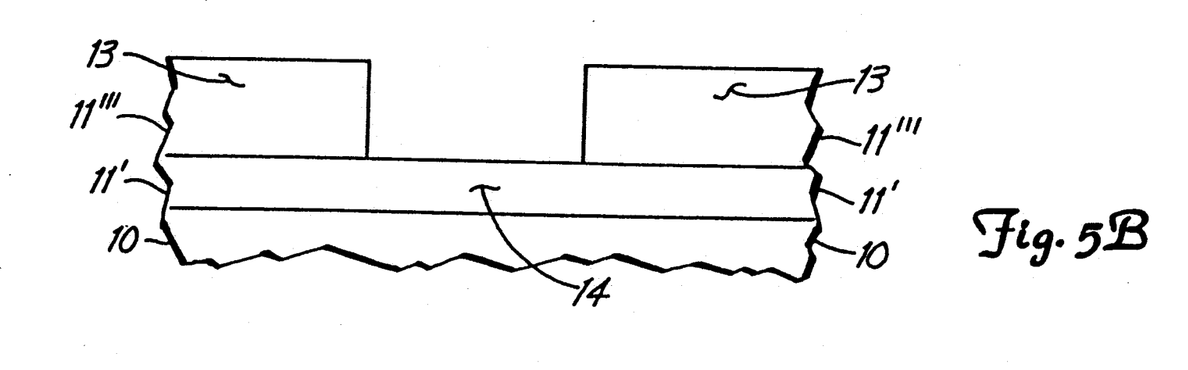

This is followed by etching through layer 11" to reach layer 11' as shown in FIG. 5B. Here, reactive ion etching is used to provide the openings in layer 11". As a result, layer 11" has been redesignated layer 11''' to reflect the changes therein due to this etching. Such etching leads to layer 11''' forming the elevated portions 13, and layer 11', as the etch stop, forms the depressed portions 14 where exposed on insulator 11.

Thereafter, composite magnetic structures are formed as bit structures 12, or memory cells, both on the upper surfaces of elevated portions 13 of layer 11''', and on the exposed portions of layer 11' forming the insulator layer depressed portions 14 to result in adjacent ones of these composite magnetic structures being offset from one another. Thus, the thickness of layer 11''' is determinative of the offset distances which will result between adjacent structures, and will always be chosen so that the resulting offset distance is at least twice the thickness of the intermediate layer between the ferromagnetic memory thin-film layers.

Figure 5C:
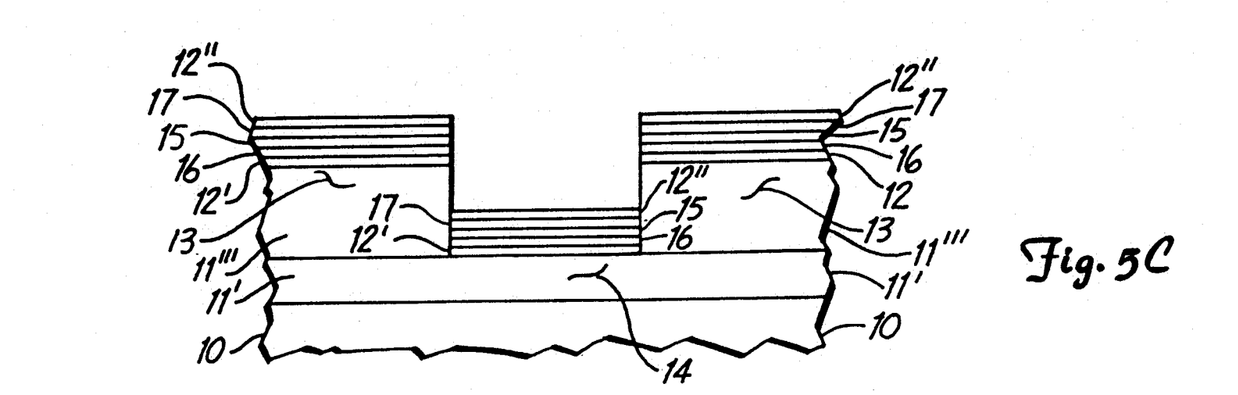

The formation of the composite magnetic structures for bit structures 12 are begun first by sputter depositing a layer of silicon nitride, 12', 100 to 500 Å thick over layer 11''' and over the exposed portions of layer 11' so that all surfaces to receive the next deposition are surfaces formed of silicon nitride. The sides of the openings in layer 11''' are formed to be quite steep and, if sufficiently close to vertical, there will be relatively little material deposited thereon, and perhaps essentially none, in the various steps in forming the composite magnetic structures to serve as bit structures 12. Otherwise, ion milling at a relatively small angle above the plane of the surfaces of layer 11''', typically 20°, must be used to remove material preferentially from the side of the openings in layer 11''' to be certain that no magnetic structure material remains between adjacent bit structures. Such unwanted material would then cause the very flux closure between adjacent devices again that was to be avoided by the offsets. Hence, the resulting composite magnetic structures will be shown without any materials on the sides of the openings as must be achieved at least with respect to the magnetic materials in such structures.

Sputter deposition (in the presence of an easy axis orientation magnetic field) is used to provide the magnetoresistive, anisotropic ferromagnetic thin-film memory layer on silicon nitride layer 12'. This layer is again formed of 60% nickel, 20% cobalt and 20% iron, and is formed to a thickness of from 100 to 200 Å. Ion milling is used to form the ferromagnetic thin-film layer into film portions 16, one for each of the bit structures being fabricated. An intermediate layer is then formed by sputter deposition of tantalum nitride to a thickness of 30 to 70 Å, this layer then being reactive ion etched to yield portions 15 thereof each confined in its major surface to dimensions approximately the same as the major surface dimensions of film portion 16 thereunder.

Another magnetoresistive, anisotropic ferromagnetic thin-film memory layer is again sputter deposited, as above, and ion milled to provide the second ferromagnetic memory film portions 17 having major surface dimensions similar to those of the major surfaces of portions 15 and 16, with the thickness of film portions 17 being approximately that of a film portion 16. Finally, a layer of tantalum nitride is sputter deposited to a thickness of 50 to 300 Å, and reactive ion etching is again used to provide portions, 12", with major surface dimensions approximately the same as that of layers 14, 16 and 17. Layer 12" is an insulator and is used to passivate the surface of ferromagnetic thin-film memory film portion 17. The major surface dimensions of portions 16, 15, 17 and 12" are on the order of 0.5 µm. The results of these steps are shown in FIG. 5C.

A tungsten layer is then sputter deposited over the composite magnetic structures to a thickness of 1,000 to 6,000 Å. Reactive ion etching of this tungsten layer is performed on those portions thereof over bit structures that are formed above the depressed portions 14 of the insulator layer, or over those bit structures 12 above the portions of layer 11' that are not covered by portions of 11'''. As a result, just those bit structures 12 which are above portions of layer 11' not covered by layer 11''' are used as bit structures which store information in the digital memory, and those bit structures adjacent thereto are electrically shorted by the tungsten metal thereabove.

These tungsten layer remnants above, and at either end of, those bit structures 12 being used to store information provide the electrical connections to such bit structures, and the sense line interconnection path from these connections is carried through the tungsten layer remnants over the adjacent bit structures formed on elevated portions 13 to the next bit structures beyond formed in the depressed portions 14 above those portions of layer 11' not covered by layer 11'''. Thus, every other bit structure 12, those above the insulator depressed portions 14, is used to store information, and is connected in series with a plurality of others interconnected by the remnant tungsten metal portions, 18', to form a sense line. Thus, the etching of the tungsten layer forms bit junctures 18 as well as shorting bars over those bit structures 12 formed on elevated portions 13. Hence, the memory cell density is halved by this method of fabrication over what is shown in FIG. 3, but ease of fabrication makes this a good choice since the reduction in size of the bit structures is so significant as to leave a very dense memory despite the bit structures provided being halved insofar as the number of those bit structures actually used.

Figure 5D:
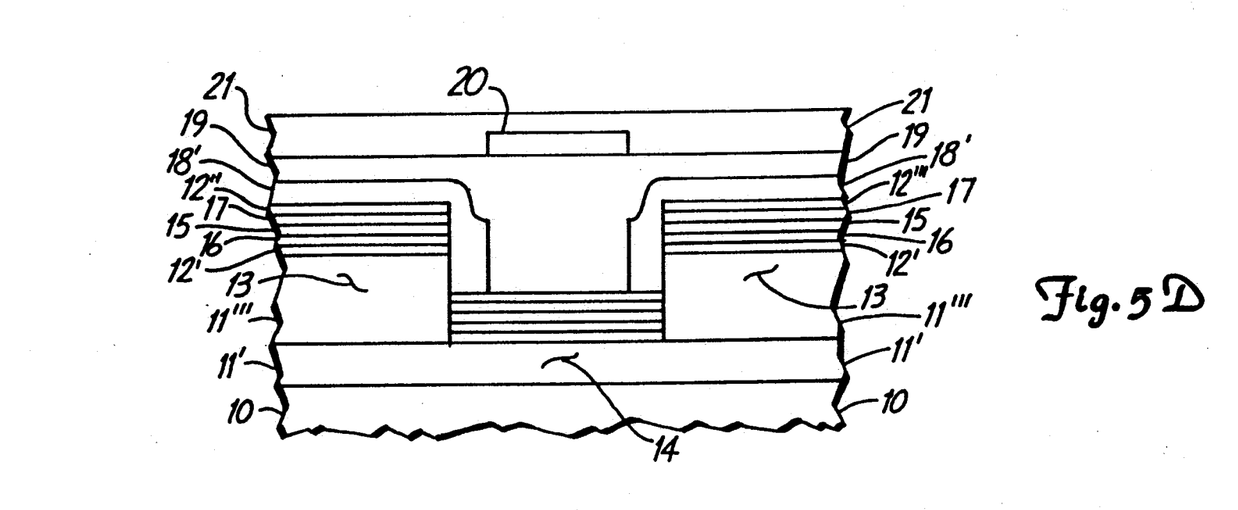

Thereafter, insulating layer 19 of silicon dioxide is formed over bit structures 12 and bit junctures-shorting bars 18' through sputter deposition to a thickness of 2,000 to 6,000 Å. Wordlines 20 are formed, but only over those bit structures 12 which are used to store information in the digital memory, that is, those located above insulator layer depressed regions 14, or where layer 11' is not covered by layer 11'''. Wordlines 20 are formed of aluminum alloyed with 4% copper through sputter deposition to a thickness of 1,000 to 10,000 Å. Passivation layer 21 is formed by chemical vapor deposition to a thickness of 5,000 to 10,000 Å using silicon nitride. Prior to the formation of passivation layer 21, interconnections from the chip memory structure portion, including the sense lines and the wordlines therein, to the integrated circuits below in substrate 10 are also provided in conjunction with the provision of wordlines 20, but such interconnections and the related operating circuitry in substrate 10 are not shown in FIGS. 5A through 5D. The results of these last steps are shown in FIG. 5D.

An alternative is to provide each word line between the corresponding bit structure 12 and a "keeper" magnetic layer structure to thereby improve flux closure about that wordline 20 and to also reduce magnetic interference with adjacent bit structures. One way of accomplishing such an arrangement is to provide the wordline and the keeper below, and as part of, elevated portions 13 on which half of bit structures 12, more or less, are formed. Thus, in FIG. 6A, layer 11' is again provided of silicon dioxide and in approximately the same thickness as described above, although possibly 1,000 Å thinner. Layer 11" is again a silicon intirde layer, but here it is only 100 to 300 Å thick, again provided to keep the oxide layer from being in direct contact with the magnetoresistive, anisotropic, ferromagnetic thin-film memory layer to prevent oxidation of that layer.

Figure 6A:
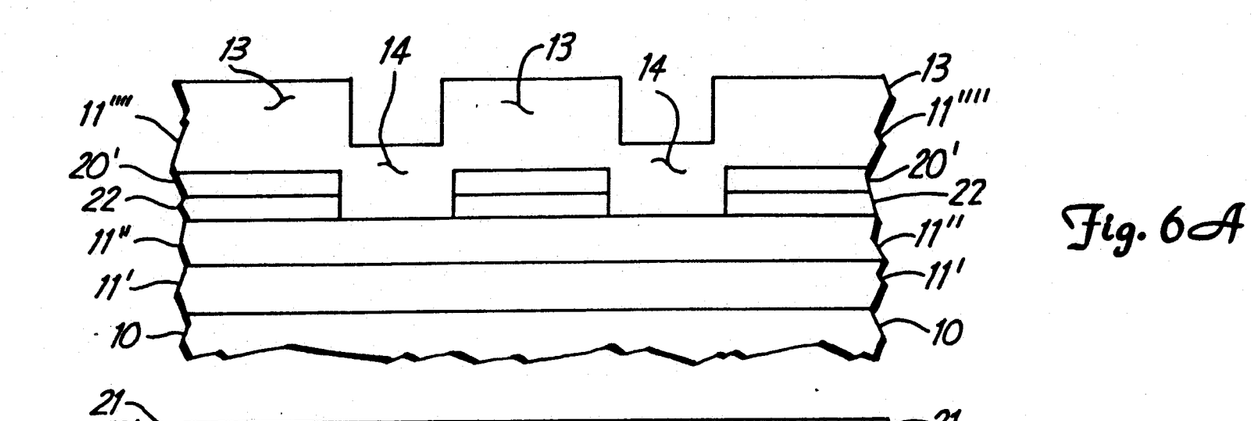
FIGS. 6A and 6B are diagrammatic representations of the results of steps taken in fabricating a device embodying the present invention.

A layer of such ferromagnetic thin-film is sputter deposited to a thickness of 100 to 300 Å, and this layer is ion milled to leave portions thereof, 22, as "keeper" structures having major surface dimensions approximately those of the layer and film portions forming bit structures 12 to be provided thereover in subsequent steps. Following this provision, the word line metal deposition is performed using tungsten to a thickness of 200 to 1,000 Å, and reactive ion etching is used to remove the tungsten everywhere except where positioned across ferromagnetic thin-film portions 22 as the resulting wordline, now designated 20', extends across successive sense lines at corresponding bit structures in each.

Once "keeper" structures 22 and corresponding wordlines 20' have been provided, the remainder of insulator layer 11, now designated 11'''', is provided, and elevated portions are formed therein over keeper structures 22 and wordlines 20', with depressed portions being formed therebetween. Again, this can be done using two layers of different materials so that one provides an etch stop for the other but, in the structure fabricated here, a single layer of silicon dioxide 2,000 to 6,000 Å thick is provided and a timed etch is used to provide the depressed portions 14 therein leaving pairs of elevated regions 13 adjacent thereto. The results of these steps are shown in FIG. 6A.

Thereafter, the composite magnetic structures to serve as bit structures 12 are fabricated as before to give results like the results shown therefor in FIG. 5C. The introduction of bit junctures 18 again must be done to connect adjacent bit structures 12, and again this is done by providing shorting bars which electrically short circuit at every other bit structure 12 along each sense line. However, in the present circumstance, in contrast to the structure in FIG. 5D above, those bit structures 12 on elevated portions 13 are the ones to be used for the storage of digital bits, since the wordline and keeper structures are provided therebelow, rather than the bit structures over the depressed portions 14. Thus, a tungsten layer is again sputter deposited over the composite magnetic structures, and reactive ion etching is used to remove those portions thereof located over much of those bit structures 12 provided on elevated portions 13 to result again in bit juncture and shorting bar combinations, 18".

Figure 6B:
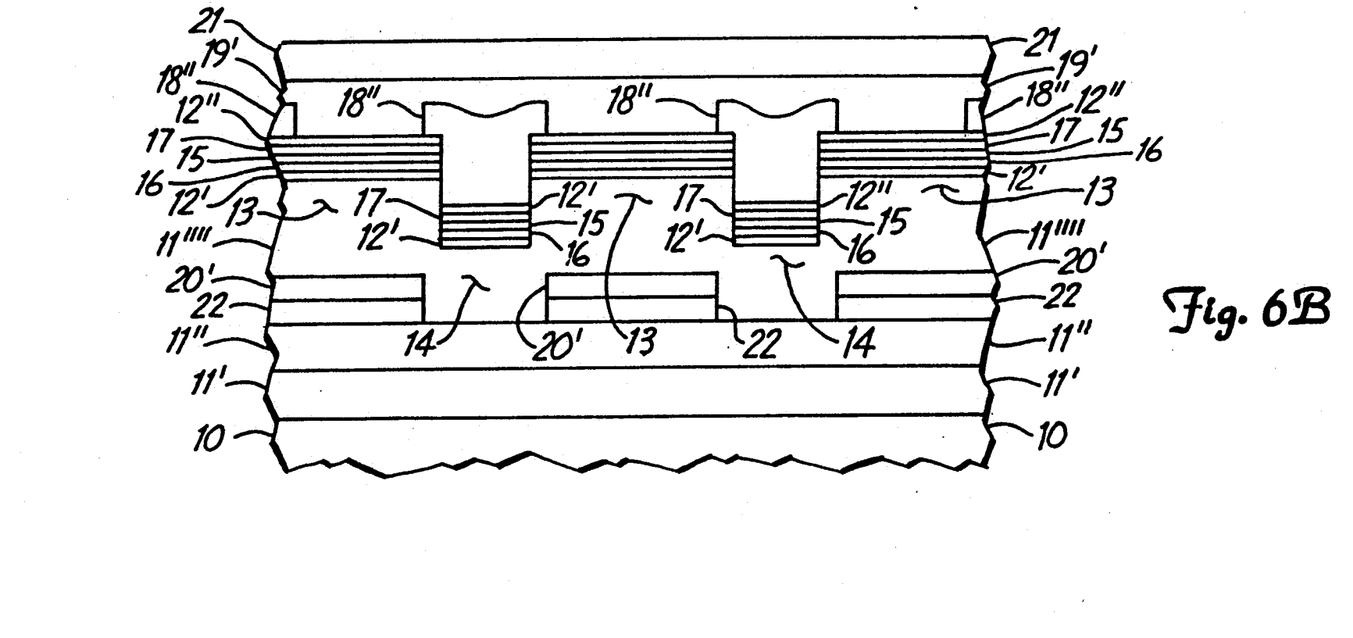

Finally, a passivation layer for this memory structure chip portion could be next provided since no intermediate insulative layer 19 and wordline are needed in this device fabricated as so far described, since wordline 20' was previously provided. However, the interconnections from the circuits in substrate 10 to various portions of the memory require that an intermediate insulative layer of silicon dioxide again be provided. Thus, such a layer, 19', is provided by sputter deposition with a thickness of 2,000 to 6,000 Å, and is opened as needed by reactive ion etching to enable the chip memory structure portion to be interconnected with the integrated circuits in substrate 10.

Such interconnecting is followed by providing a passivation layer 21 through chemical vapor deposition. This layer may be 5,000 to 10,000 521 of silicon nitride. The result is shown in FIG. 6B.

A further variation eliminates the use of metallic bit junctures for interconnecting adjacent bit structures 12, thus saving a metal etching step, and also eliminates the corresponding shorting bars which occurred in the embodiment shown in FIGS. 5D and 6B, although shorting bars can be used also if desired. In this variation, a high resistivity material conductor is deposited across all of the bit structures 12 in a sense line thereby interconnecting the adjacent sense line bit structures, but also shunting the effective series resistance of the sense line between the ends thereof. Because of this situation, the sheet resistance of the high resistivity interconnecting material along a sense line must be several times greater than the effective sheet resistance of the sense line if a sufficiently large output signal level is to be obtained from the magnetoresistive state sensing to be used with bit structures 12 thereunder.

Further, the resistance of this material across the gaps between adjacent bit structures 12 due to the offset therebetween must be small compared to the effective series resistance of adjacent bit structures 12 so that there is a relatively low resistance interconnection therebetween compared to the resistance of the adjacent bit structures. If this criterion is met, the bit structure resistance, the source of output signals from the sense line bit structures, dominates the interconnection resistance to assure sufficient output signal magnitude.

Thus, the memory cell length must be greater than the offset distance times (a) the ratio of the sheet resistance of the high resistivity interconnection material to the effective sheet resistance of bit junctures 12, times (b) the ratio of the interconnection resistance between adjacent bit structures to the effective series resistance of a bit structure 12, if the memory cell is to have enough resistance to provide an output signal of sufficient magnitude to be sensed at the end terminals of the sense line in which it is provided. As an example, if the offset distance between adjacent bit structures 12 is 250 Å and the above indicated ratios are each 5, the cell length must be at least 0.625 μm. The resistance across a bit structure 12 in the sense line will typically be 20% higher in the present variation as compared to the previous ones where shorting bars are used.

Figure 7:
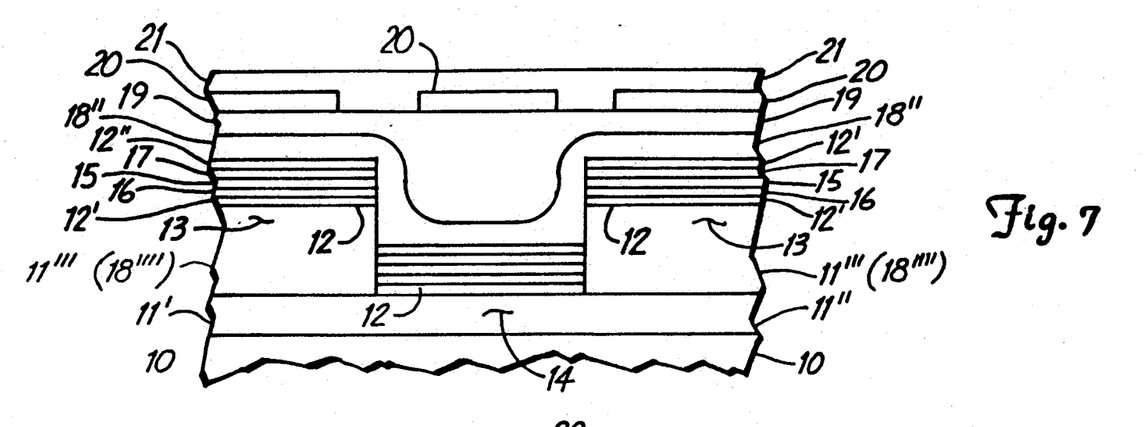
FIG. 7 is a diagrammatic representation of a portion of a device embodying the present invention.

Thus, this variation of the chip memory portion can be fabricated following steps shown in FIGS. 5A through 5C, and essentially as shown in FIG. 5D except that bit juncture-shorting bars 18' are replaced with high resistivity interconnection material which is continuous across all of the bit structures 12 in a sense line. A typical high resistivity material would be chromium doped silicon having a thickness of 200 to 1,000 Å, and provided by sputter deposition methods. After deposition of such a layer, reactive ion etching would be used to remove that layer except for portions, 18''', which would remain over each of the sense lines in the digital memory. Thereafter, an insulating layer 19, wordlines 20 and a passivating layer 21 would be provided again as described above. The result is shown in FIG. 7.

Note that each bit juncture 12 in a sense line is used for storing information rather than having every other one shorted out by a shorting bar. Thus, each of bit structures 12 has a wordline 20 across therefrom rather than eliminating every other word line over those bit structures having a shorting bar thereacross. The result is shown in FIG. 7.

However, shorting bars can be provided with respect to every other one of bit structures 12 to reduce the electrical resistance between those bit structures remaining as information storage sites in a sense line. Thus, elevated portions 13 in insulator layer 11'''' can be replaced under bit structures 12 by a tungsten layer portion having the major surface dimensions of the bit structure thereabove, with the rest of layer 11'''' still provided about such shorting bars between the sense lines. Thus, in FIG. 7, the portions shown designated as layer 11'''' would alternatively be shown as shorting bars, 18''''', in this alternative. As a result, 18''''' has been placed in parentheses next to the designation 11'''' in FIG. 7 to show this alternative.

As can be seen, shorting bars 11''''' may interconnect each adjacent bit structure 12 to reduce the interconnection resistance therebetween, but they clearly reduce the total sense line resistance by shorting half of the bit structures therein. On the other hand, those bit structures 12 formed on the corresponding shorting bar 18''''' are again eliminated as effective information storage sites by being shunted by a good electrical conductor so that only half of the bit structures 12 serve as information storage sites.

As indicated above, those bit structures which are not shorted out by a shorting bar appear in FIG. 7 to have the ends thereof connected directly to shorting bars 18''''' which could further reduce the sense line total resistance. However, this fabrication arrangement does not necessarily assure that there is a good low resistance contact between the ends of bit structures 12 provided over depressed portions 14 and those shorting bars 18''''' adjacent thereto. Thus, high resistivity interconnection layer 18''' assures that there is an interconnection of acceptably low resistance between those bit structures provided over depressed portions 14.

Figure 8:
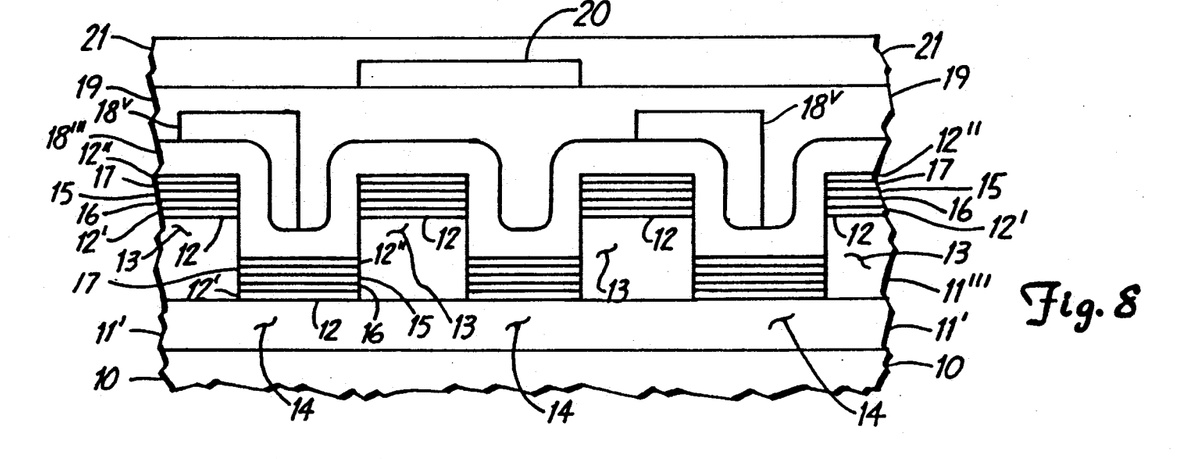
FIG. 8 is a diagrammatic representation of a portion of a device embodying the present invention.

The first variation shown in FIG. 7 without shorting bars 18''''' provided beneath every other bit structure 12 can be alternately configured to have differently positioned shorting bars, 18$^v$, provided therein to thereby permit multiple bit structures to serve as a single memory cell for storing one bit of digital information. This arrangement is shown in FIG. 8 where a tungsten layer has been provided over high resistivity interconnection layer 18''' by sputter deposition, and then has been etched using reactive ion etching methods to leave shorting bars 18$^v$ over every third transition from a bit juncture 12 on an insulator layer elevated portion 13 to a bit juncture 12 on an insulator layer depressed portion 14.

As a result, two complete bit structures are shown between each of shorting bars 18$^v$, and portions of two others. The region between shorting bars 18$^v$ has a single wordline 20 thereover so that these bit structures under this region act in concert with one another as a single memory cell. The output signal contribution from each of those multiple bit structures 12 in one memory cell adds to the total memory cell output signal, while the offsets between them are sufficient to assure that each has the desired orientation of magnetizations in its upper and lower memory film portions 17 and 16. That orientation, again, is having the magnetizations in each film portion be in the opposite directions to one another and along the easy axis therein. Thus, effectively three 0.4 μm bit structures 12 will result in an output signal equal to that provided by a single bit structure having the dimensions of 1.2 μm by 0.4 μm.

In this arrangement, those bit structures 12 in a memory cell are interconnected in series with one another by high resistivity interconnection layer 18'''. Shorting bars 18$^v$ provide the primary interconnection between each memory cell.

Although the present invention has been described with reference to preferred embodiments, workers skilled in the art will recognize that changes may be made in form and detail without departing from the spirit and scope of the invention.

What is claimed is:

1. A ferromagnetic thin-film based digital memory using magnetoresistive sensing, said memory comprising:

a first storage line structure having a first storage line pair of end terminals adapted to conduct electrical current in at least one direction, said storage line structure end terminals having electrically connected in series therebetween a plurality of bit structures with each said bit structure electrically connected at a bit juncture to at least one other said bit structure such that adjacent said bit structures are offset from one another in a direction substantially perpendicular to that path followed by said first storage line structure in extending between said first storage line structure end terminals, each said bit structure having a structure comprising:

an intermediate layer of a kind of separating material, said intermediate layer having two major surfaces on opposite sides thereof such that said major surfaces are separated by a separating layer thickness, and with said adjacent bit structures being offset from one another, as aforesaid, by an offset distance exceeding said separating layer thickness, and memory film on each side of intermediate layer major surfaces with said memory film being of a magnetoresistive, anisotropic, ferromagnetic material, and a plurality of word line structures each having a pair of word line end terminals adapted to conduct electrical current in at least one direction with each of said pairs of word line end terminals having an electrical conductor electrically connected therebetween which is located across an electrical insulating layer from said memory film on one of said major surfaces of said intermediate layer of a selected one of said bit structures.

2. The memory of claim 1 wherein said separating layer thickness of said intermediate layer is less than 100 Å.

3. The memory of claim 1 wherein said memory film on said major surfaces of said intermediate layer has a thickness less than 200 Å.

4. The memory of claim 1 wherein said memory film on each of said major surfaces of said intermediate layer is formed of first and second separate memory films each of which is on an opposite one of said intermediate layer major surfaces.

5. The memory of claim 4 wherein each of said first and second separate memory films has dimensions sufficiently small so as to have a single magnetic domain form therein.

6. The memory of claim 4 wherein an easy axis of magnetization in each of said first and second separate memory films in said bit structures is substantially perpendicular to that direction of extent of said bit structure corresponding thereto in extending to any said bit junctures electrically connected to that said bit structure.

7. The memory of claim 4 wherein selected ones of said bit structures have ferromagnetic closure bodies located across an electrical insulating layer from said memory film on one of said major surfaces of said intermediate layer thereof with a corresponding said word line located therebetween.

8. The memory of claim 4 wherein said bit junctures in said first storage line structure are formed of a substantially conductive material, and wherein at least some of said bit junctures each extend over, and in electrical contact with, one of two said bit structures electrically connected thereto in said first storage line structure to join with another said bit juncture electrically connected to that said bit structure.

9. The memory of claim 4 wherein said bit junctures in said first storage line structure are formed of a substantially resistive material which also extends over, and is in electrical contact with, said bit structures in said first storage line structure.

10. The memory of claim 9 wherein substantially conductive material bodies are positioned at selected locations on said substantially resistive material such that successive ones of said substantially conductive material bodies are over two said bit structures not adjacent to one another in said first storage line structure.

11. The memory of claim 9 wherein substantially conductive material bodies extend over, and are in electrical with, every other one of said bit structures in said first storage line structure.

12. The memory of claim 1 wherein an easy axis of magnetization of said memory film in said bit structures is substantially perpendicular to that direction of extent of each said bit structure in extending to any said bit juncture electrically connected thereto.

13. The memory of claim 1 wherein said offset extends a distance that is at least twice said separating layer thickness.

14. The memory of claim 1 wherein said first storage line structure is formed on a substrate having a semiconductor material integrated circuit portion therein.

* * * * *